United States Patent [19]

Evans

[11] 4,060,032
[45] Nov. 29, 1977

[54] SUBSTRATE FOR COMPOSITE PRINTING AND RELIEF PLATE

[75] Inventor: Charles P. Evans, Trumbul, Conn.

[73] Assignee: Laser Graphic Systems Corporation, Sudbury, Mass.

[21] Appl. No.: 736,026

[22] Filed: Oct. 27, 1976

Related U.S. Application Data

[63] Continuation of Ser. No. 579,741, May 21, 1975, abandoned.

[51] Int. Cl.² ............................................. B41N 1/12
[52] U.S. Cl. .................................. 101/401.1; 101/467; 346/76 L; 428/483; 428/307
[58] Field of Search .......................... 346/76 R, 76 L; 101/401.1, 471, 467; 428/307, 483

[56] References Cited

U.S. PATENT DOCUMENTS

| | | | |
|---|---|---|---|
| 3,032,414 | 5/1962 | James et al. | 96/91 |
| 3,101,668 | 8/1963 | Leeds | 101/401.1 |
| 3,207,621 | 9/1965 | Newman et al. | 117/36.1 |
| 3,470,059 | 9/1969 | Jonnes | 101/401.1 |
| 3,560,994 | 2/1971 | Wolff et al. | 346/135 |
| 3,615,972 | 10/1971 | Morehouse et al. | 156/276 |
| 3,619,335 | 11/1971 | Bryan | 428/483 |
| 3,644,014 | 2/1972 | Hirshberg | 346/76 R |
| 3,734,768 | 5/1973 | Smith | 428/307 |
| 3,742,853 | 7/1973 | Landsman | 346/76 L |
| 3,832,948 | 9/1974 | Barker | 101/401.1 |

OTHER PUBLICATIONS

IBM Tech. Disc. Bull., vol. 14, No. 8, Jan. 1972, p. 2358, Greenblott.

*Primary Examiner*—Clyde I. Coughenour
*Attorney, Agent, or Firm*—Seidel, Gonda & Goldhammer

[57] ABSTRACT

A composite structure for making printing plates and other surfaces in relief is improved by reducing the density of a polymer substrate thereby increasing the amount of material removed per unit of time by a given total amount of energy. The density of the polymer substrate is reduced by making it cellular or poriferous using expandable micro capsules made of thermoplastic shell and a nucleus of a liquified blowing agent.

5 Claims, 6 Drawing Figures

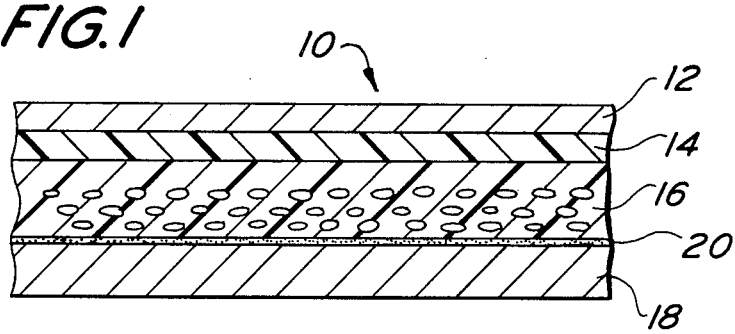
FIG. 1
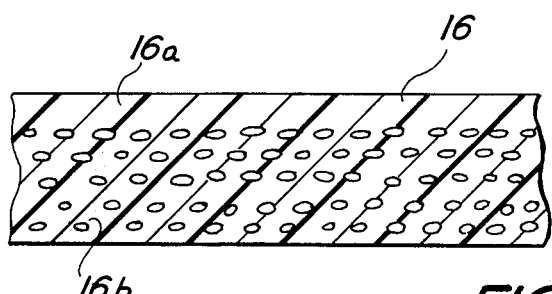
FIG. 2
FIG. 3
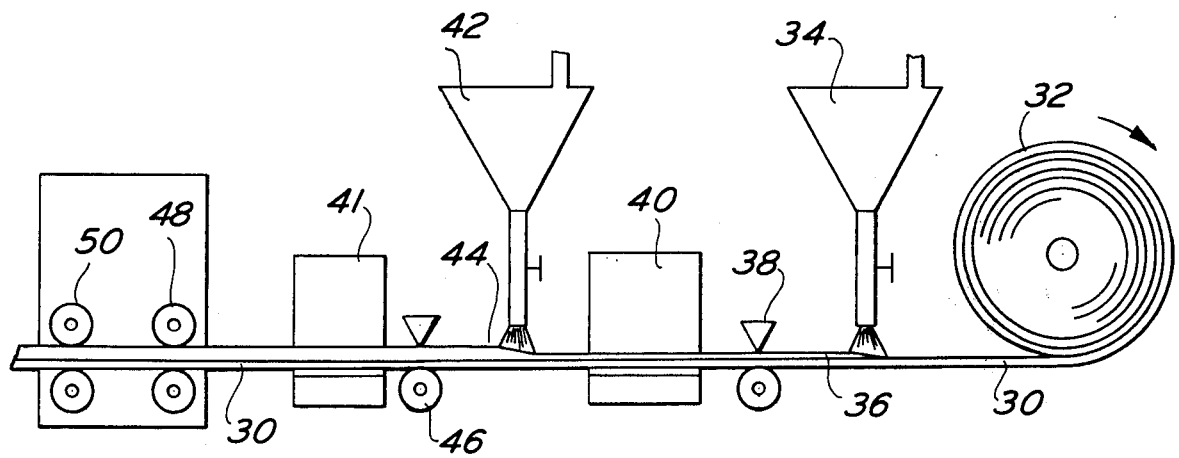

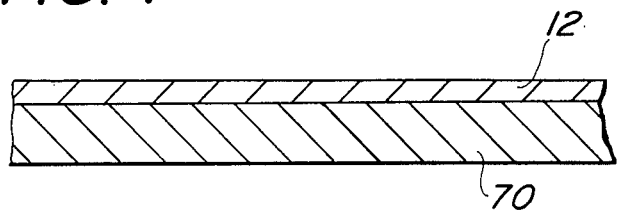
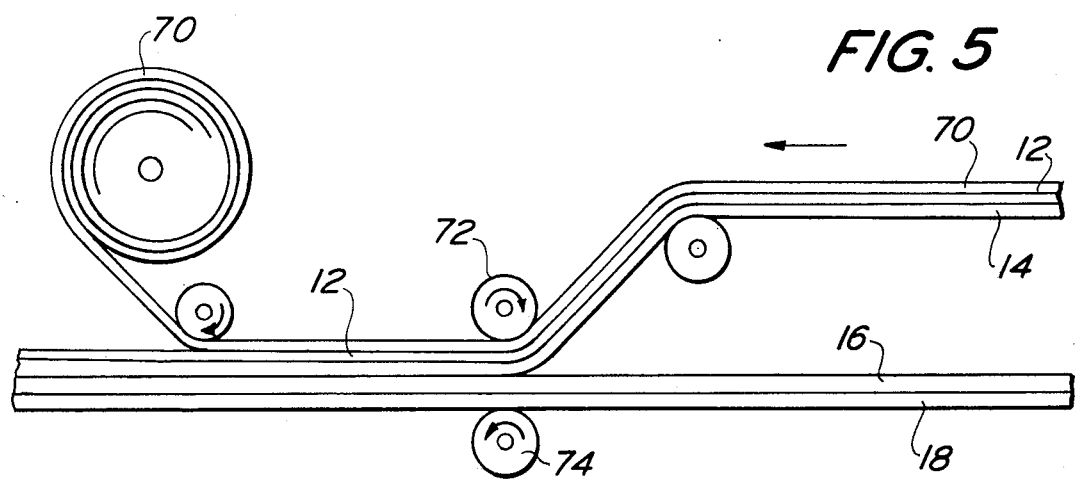
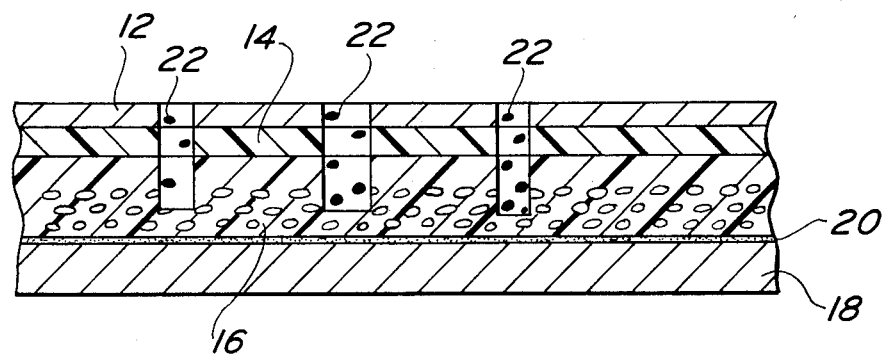

SUBSTRATE FOR COMPOSITE PRINTING AND RELIEF PLATE

This is a continuation of application Ser. No. 579,741 filed May 21, 1975, now abandoned.

This invention relates to a composite plate for use in making a printing plate or other surface in relief, and a process for making such a composite plate. More particularly, this invention relates to a composite plate comprising (1) a substrate which ultimately is developed into the surface in relief; (2) a writing layer which ultimately will define the surface relief pattern after processing by apparatus not forming a part of this invention; (3) a barrier layer intermediate the writing layer and the substrate for maintaining the integrity of the writing layer while the substrate is being developed into a surface in relief by apparatus not forming a part of this invention; and (4) preferably but not necessarily a reinforcing metal backing affixed to the substrate. Still further, this invention relates to improvements in the function of the aforesaid substrate and barrier layer and in a process and apparatus for assembling the composite plate.

In co-pending patent application Ser. No. 86,656, filed Nov. 4, 1970, now U.S. Pat. No. 3,832,948, there is disclosed a method and apparatus for making printing plates and other surfaces in relief. As disclosed in that application, the plate to be developed into a surface in relief consists of a substrate (preferably a polymer) coated with a relatively thin radiation absorptive film (preferably metal) that defines a writing layer. The process for developing the plate into a surface in relief includes first writing in the writing layer by scanning it with an appropriately modulated first coherent radiation of appropriate power and at a wave length that raises its resolving qualities sufficiently for it to remove, as by ablation, vaporization or otherwise, portions of the writing layer. This creates a surface pattern of film (the writing layer) and exposed substrate. The substrate is developed into a surface in relief defined by the pattern in the writing layer by using a second relatively high power, longer wave length source of radiation, such as infrared radiation, to remove exposed portions of the substrate. The second radiation is reflected by the remaining portions of the writing layer but absorbed by the substrate. Those portions of the substrate which have been exposed by removal of the writing layer absorb the second radiation and are removed, as by ablation, melting, vaporization, fusion or otherwise. The result is the formation of a surface in relief. The precise information on the surface in relief depends directly upon the information conveyed during the writing step. If the information used to control the writing step and hence the pattern formed in the writing layer consists of copy and/or graphic material, then a printing plate is formed.

The commercial value of the above process when used to manufacture printing plates lies primarily in the ability to form a printing surface of commercial quality, directly from copy if desired, in the minimum possible time. To do this, the second coherent radiation must remove portions of the surface of the substrate at the lowest possible joules per cubic centimeter in the minimum possible time for a given radiation power. For this reason, substrate materials are best selected from a group of relatively unstable polymers, such as cellulose nitrate, which vaporize at relatively low joules per cubic centimeter. Still further, the integrity of the writing layer must be maintained during the period when the relief pattern is being formed in the surface of the substrate. The destruction and/or displacement of any portion of the writing layer during this time period causes distortion and loss of image in the relief pattern.

As stated, to achieve a true relief image in the surface of the substrate, it is necessary to maintain the integrity of the remaining film pattern during the developing step since it serves to define the surface in relief. In practicing the above-described process, it has been found that some polymer substrates, such as cellulose nitrate, contain substances such as plasticizers and solvents which adversely affect the retention of the metal film writing layer especially while the substrate is being developed into a surface in relief. These substances, or other chemical reactions due to the heating process, tend to exude to the interface between the substrate and writing layer and result in the destruction and/or displacement of the writing layer while the surface in relief is being formed. To prevent this, a barrier made of a more stable polymer can be placed between the substrate and the writing layer. This barrier eliminates the displacement or disappearance of the metal film writing layer during the development of the substrate by preventing the deleterious substances or other reactions from affecting the film.

The barrier layer must be chosen with certain constraints to be effective. First, the barrier itself must be a polymer that will absorb the wave length of energy of the developing laser; i.e., it must be capable of being removed by the developing laser. Secondary, the material used for the barrier must itself be capable of maintaining the integrity of the writing layer. Finally, the barrier must be capable of being rapidly removed by the developing laser. State otherwise, the rate at which the barrier is removed must not significantly affect the rate at which the substrate is developed by the developing coherent radiation. Therefore, the thickness of the barrier is also important and in general should be no greater than is necessary to protect the integrity of the metal film writing layer. See U.S. patent application Ser. No. 336,305 filed Jan. 27, 1973.

It has been determined that a thin layer of an acrylic polymer functions very well as a barrier layer. However, the use of such polymers has resulted in another problem. After the formation process, a residue of small beads of material was found in the bottom of the cuts or valleys formed in the surface in relief. This material has a generally spherical or droplet shape and is a detriment to the printing process. Its presence is therefore unacceptable. It was further found that the material composition of these small beads of residue was primarily the same as the substrate material and not the barrier material, but that the formation of these beads was caused by the action of the barrier layer while being subject to the heat of the radiation energy, and the interaction of this with the substrate during the continuing process.

There is disclosed herein an improved barrier layer that eliminates the interaction between the barrier layer and the substrate and eliminates the residue as described above.

It has been found that the beading problem can be removed by making the barrier layer more absorptive of the incident radiation. As a result, the decomposition of the underlying substrate does not begin until the vaporization of the barrier layer is virtually complete. Thus, the barrier layer is essentially entirely vaporized before vaporization of the underlying substrate which is preferably cellulose nitrate. Having been decomposed first, it cannot interact with the remaining substrate.

There are many materials which can be added to the barrier layer to make it more absorptive of the coherent radiation which, for example, may be infrared radiation. However, such materials must not adversely affect the function of the barrier layer which is to protect the writing layer against destruction and/or displacement during development of the substrate into a surface in relief. It has been found that additives for the preferred acrylic polymer barrier layer that achieve this desirable result include finely divided graphite and triphenyl phosphate both of which absorb radiation in the infrared wave lengths.

As stated, it is most desirable that the surface in relief be formed in the minimum possible time. This can be accomplished using high power coherent radiation such as infrared radiation generated by a carbon dioxide laser. This radiation is used to remove exposed barrier and substrate material. It has been found that a polymer substrate made from cellulose nitrate results in the minimum time to make a printing plate or other surface in relief using a laser operating at a given power and generating coherent radiation at infrared wave lengths. However, it is desirable that the rate at which material is removed from the surface of the substrate be reduced even farther than that obtainable using solid cellulose nitrate or other relatively unstable polymers. It has been determined that this can be accomplished if the density of the substrate is reduced. In other words, the rate of removal can be further minimized for the cellulose nitrate or other polymer if its density is decreased. It should be noted, however, that merely reducing the density of the substrate material is not in and of itself sufficient. In addition, the resulting printing plate must have appropriate mechanical material properties. In particular, it must have surface characteristics satisfactory for use in letter press printing including good compressive and bending strength.

In accordance with what is described herein, the density of the substrate is reduced by using a polymer containing microspheres which initially may be either in their expanded or unexpanded state. There is disclosed herein a substrate which has a proous or cellular structure (preferably a closed cell structure) so as to minimize the number of joules per cubic centimeter required to remove the substrate material; or, conversely, increase the rate at which a given total energy and/or energy density removes such material thereby minimizing the time required for such removal.

Several polymer systems that will work have been found. One preferred system comprises a substrate, which in its final form, is a sheet of appropriate dimensions, consisting of a relatively unstable polymer, for example, cellulose nitrate as the base or carrier material, throughout which there is a uniform dispersion of expanded, hollow, micro-spheres of a suitable polymer as, for example, polyvinylidene-acrylonitrile resin (SARAN) in such proportion to the base material as to result in the desired overall material density which is as low as possible consistent with structural mechanical limitations. Moreover, the mechanical strength of the resulting substrate is increased for use in letter press printing by cross-linking the cellulose nitrate through the introduction of a third polymer into the base solution such as trimethlol propane trimethacrylate. The substrate as described above can be further strengthened by casting it in combination with a surface layer of relatively thin solid cellulose nitrate. There is also disclosed herein a process for manufacturing the aforesaid substrate.

The writing layer of the composite plate may be made of thin metal film overlying the barrier layer. In the course of fabricating the composite plate, the metal film such as copper may be first vapor deposited on a carrier and transferred to the barrier layer or alternatively deposited on the barrier layer after the barrier layer has been applied to the substrate. As previously indicated, the barrier layer may (but need not) be an acrylic polymer. The important criterion of the barrier layer is that it contain no chemical compounds which exude toward the interface or have otherwise deleterious effects upon the metal film that defines the writing layer. The disadvantage of a barrier layer is that it requires significantly higher energy to remove than does the cellulose nitrate substrate. But a thin layer of polymer does not substantially affect the joules per cubic centimeter required to remove the composite of barrier layer and substrate and yet it does protect the metal film writing layer during the removal process.

When a combined writing layer and barrier layer are first formed on a carrier and then transferred to the substrate, there may be created a problem in obtaining a defect-free transfer of the combined writing and barrier layers from the carrier to the substrate. Obviously, both the bond between the metal film and the polymer barrier layer and the bond between the barrier layer and the substrate must be stronger than the bond between the metal film (writing layer) and the carrier for a successful transfer to take place. It therefore is necessary to insure this relationship between bonds if a complete transfer from the carrier to the barrier layer or the substrate is to be consistently achieved.

It should be apparent that any of the foregoing improvements in the elements that make up a composite printing plate may be used singly or in combination to provide an improved and more useful printing plate.

For the purpose of illustrating the invention, there are shown in the drawings forms which are presently preferred; it being understood, however, that this invention is not limited to the precise arrangements and instrumentalities shown.

FIG. 1 is a partial sectional view of a composite plate.

FIG. 2 is an enlarged partial sectional view of the substrate.

FIG. 3 illustrates the process for manufacturing a substrate.

FIG. 4 is a partial transverse sectional view of the writing layer on a carrier.

FIG. 5 illustrates a laminating process used in the manufacture of a composite plate.

FIG. 6 illustrates beading which occurred before the incorporation of an improved barrier layer.

Referring now to the drawing in detail, wherein like numerals indicate like elements, there is shown in FIG. 1 a sectional view of a composite plate 10 constructed according to the principles of the present invention.

The composite plate 10 includes a thin metal writing layer 12 affixed to a barrier layer 14. By way of example, but not limitation, the writing layer 12 may be a copper film that has been transferred from a carrier to the barrier layer 14 in a manner describe hereinafter. For purposes of illustration, the writing layer 12 is shown greatly exaggerated in thickness. Its thickness preferably is in the range of 400 A to 1200 A. Of course, metals other than copper may be used for the writing layer as determined by the purpose to which the composite plate is to be put and the wave length of the radiation source used to selectively remove portions of the writing layer. Selected portions of the writing layer are removed using controlled coherent radiation such as by way of example, light generated by an argon laser. Such removal exposes portions of the barrier laser and the underlying substrate which can then be developed into a surface in relief upon exposure to infrared radiation such as could be developed by a carbon dioxide laser.

The barrier layer 14 is intermediate the writing layer 12 and the substrate 16. Its function, as previously described, is to prevent deleterious substances from exuding or otherwise being at the interface between writing layer 12 and substrate 16, particularly when the substrate is being developed into a surface in relief. Barrier layers which accomplish this purpose can be formulated such that when cured, they contain no chemical compounds which exude toward the aforesaid interface or have otherwise deleterious effects upon the metal film writing layer particularly when the substrate is heated by the infrared radiation. Polymers in the acrylic family are an example of a material from which the barrier layer can be made. It has been found, for example, that a barrier layer made of acrylic polymers and having a thickness of approximately 0.001 inches to 0.005 inches will not significantly effect the time required for a laser of given power to develop a substrate into a surface in relief while at the same time it protects the writing layer 12 from the deleterious effects of substances which tend to adversely react at the interface causing loss of image resolution, particularly when developing half tone dots and other small elements. As used herein, acrylic polymers are thermoplastic polymers or copolymers of acrylic acid, methacrylic acid, and esters of these acids.

The polymer substrate 16 is preferably made of cellulose nitrate as hereinafter disclosed. It preferably has a thickness of approximately 0.020 to 0.025 inches. The substrate 16 may be adhered to a metal backer 18 by an adhesive 20 or the metal backer may be treated, as for example by anodizing aluminum, such that an adequate bond between substrate and metal backer is achieved without the use of a separate adhesive layer 20. Backer 18 may be made of aluminum and serves to reinforce the entire composite plate and also may be used to affix it to a roll or other printing device.

It should be understood that the composite plate 10 is only partially shown in FIG. 1 and that it need not be planar in shape. Indeed, it could be curvilinear to fit an appropriate printing device.

Although a barrier layer 14, if made of acrylic polymer, works well to maintain the integrity of the writing layer 12, the use of such a polymer without further modification creates a separate problem; that is, the development step when the infrared coherent radiation is removing during the removal of portions of the barrier layer 14 and portions of the substrate 16, there is left a residue of small beads 22 of material in the bottom of the cuts. These beads 22 are shown in greatly exaggerated form in FIG. 6. They are wholly unacceptable because they reduce the depth of relief wherever they are found and tend to cause ink to be transferred to the printed page in smears and random dot patterns thereby deleteriously effecting the quality of the printing. It is therefore necessary to modify the acrylic polymers when acrylic polymers are used for the barrier layer so as to eliminate the beads 22.

The development of the substrate 16 and the barrier layer 14 into a surface in relief is preferably effected by intense infrared radiation incident upon the barrier layer 14 and underlying substrate 16 which have been exposed by removal of the metal film 12. As a result, heat penetrates the acrylic polymer barrier layer 14 and it does not completely vaporize before vaporization and decomposition of the underlying cellulose nitrate commences. Somehow, this interaction results in the formation of small solidified beads 22 of cellulose in regions which would ordinarily ablate to a clean, flat bottom but for the presence of the acrylic polymer barrier layer.

It has been found that the foregoing problem can be resolved by modifying the acrylic polymer barrier layer 14 to incorporate a material that makes it more absorptive of the incident coherent infrared radiation. As a result, decomposition of the underlying substrate, such as cellulose nitrate, does not begin until vaporization of the barrier layer 14 is complete.

There are several additives which can be incorporated into acrylic polymers to make it more absorptive of coherent infrared radiation. The criteria which determine the material that is to be incorporated are that it should be compatible with acrylic polymers and also not effect the ability of such polymer to maintain the metal film in position during the developing step. Still further, the material incorporated into the acrylic polymer must be absorptive or incident radiation in the infrared radiation wave lengths; approximately $0.8\mu m$ - 1 mm. Two materials which meet the foregoing standards are finely divided graphite and triphenyl phosphate. Both absorb strongly in the infrared wave lengths and are compatible with acrylic polymers. Most importantly, both are effective in preventing the formation of the beads 22.

By way of example, a composite plate 10 was constructed with a substrate 16 made of a 5/6 second celluloste nitrate ss grade. The barrier layer 14 was made of .0005 inch thick polymethylmethacrylate containing by weight 25 parts by triphenyl phosphate per 100 parts of resin. The writing layer 12 was copper deposited on the barrier layer 14 to a thickness of 800 Angstroms. Portions of the copper were selectively removed using an argon laser. Thereafter, the exposed portions of the barrier layer 14 and substrate 16 were exposed to intense radiation developed by a carbon dioxide laser. No significant beading was observed and the remaining portions of the copper writing layer remained intact and were not displaced. Moreover, there was no damage to the barrier layer 14 and substrate 16 which underlay the remaining portions of the writing layer.

A control composite plate was constructed in the same manner but without incorporating triphenyl phosphate in the acrylic barrier layer 16. Upon exposure to the same laser, severe beading resulted. Repeated testing yielded consistent results as described above.

By way of another example, a second composite plate was constructed in the same manner as given in the first example above except finely divided graphite was incorporated into the barrier layer 14 at 25 parts of graphite per 100 parts of resin by weight. Again, upon exposure to a carbon dioxide laser, no beading was produced.

In general, it has been found that by incorporating either finely divided graphite or triphenyl phosphate at concentrations equal to or above 25 parts per 100 of acrylic resin by weight, no significant beading results.

The word "removed" has been used in the present application in association with the action of incident radiation upon the writing layer 12 and also upon exposed portions of the barrier layer 14 and substrate 16 to develop a surface in relief. As used in this disclosure, the word "removed" is intended to mean a process whereby the result is the absence of the writing layer 12 from a preselected area of the surface of the composite plate 10 and the absence of the barrier layer 14 and a portion of the underlying substrate 16 so as to form a surface in relief. Such processes of removal could include: (a) vaporization or boiling off of the constitutent material, (b) melting of the constituent material followed by withdrawal of the melted zone to form a crater, (c) burning of the constituent materials, (d) ablation of the constituent material, or (e) converting of the chemical structure of the constituent materials resulting in its ultimate absence.

As previously indicated, the substrate 16 is one of the major factors in providing a good composite plate for use in letter press printing. The substrate must be capable of being removed by intense infrared radiation, as by ablation, at the lowest energy rate (joules/cc) in the minimum possible time. Still further, the process of removal to produce the relief depth must result in a plate having sufficient mechanical properties and surface characteristics to be used satisfactorily as a printing plate for letter press processes.

Cellulose nitrate is the material which has been found to ablate at the lowest energy densities. Yet cellulose nitrate per se still requires a higher energy density than is desired to produce a plate in sufficient time and with reasonable amounts of radiation power to make the process readily marketable from the standpoint of competitive economics.

A composite plate can be developed into a printing plate using reasonable amounts of power and within acceptable time limits if less material need be removed. Accordingly, it has been determined that a cellular or poriferous structure be used for the substrate 16 since it has a lower density. A substrate 16 so made would require lower joules per cubic centimeter based upon the total volume of material including the volume of the gas within the cells. A number of cellular or foamed polymers have been tested, but for varying reasons, such as lack of uniformity or structural strength, they have not proved successful. Some foamed polymers formed a crater edge or other unwanted deformations in the substrate and others melted into a useless liquid pool. There is disclosed herein a substrate which is capable of being developed into a printing plate or other surface in relief within technically and economically acceptable amounts of time and power and still provide good mechanical and structural features as required for a printing plate.

The substrate described herein includes a polymer as a base, which has been converted from a solid to a cellular or low density material by use of polymer micro-spheres made of a polyvinylidine chloride (Saran) manufactured by Dow Chemical Company. In particular, the substrate disclosed herein comprises a cast cellulose nitrate sheet containing an unexpanded vinylidene chloride-acrylonitrile copolymer together with a trifunctional acrylic monomer that is cross linked in sito with the cellulose nitrate during the expansion process to increase the compression strength of the resultant cellular material. The resultant cast substrate sheet is expanded after extraction of the solvents by heating thereby reducing its density and producing a uniformly cellular material having a very accurately controlled density.

A substrate 16 in accordance with what is disclosed herein is made in the following manner. Cellulose nitrate (5/6 ss grade) resin is dissolved into a solvent mixture comprising 87% ethanol (proprietary grade) and 13% ethyl cellusolve. The ethyl cellulose is the primary solvent. To this lacquer solution is added 3–8% Saran micro-spheres manufactured by the Dow Chemical Company, Midland, Michigan, under production identification XD-1842. The final total solids in this initial lacquer solution is adjusted to 20–22% cellulose nitrate and approximately 70% ($\mp 2\%$) solvent by weight. The micro-spheres are in the range of .1 to 5 microns in diameter and comprise a thermal plastic shell and a nucleus of a liquified blowing agent. The thermal plastic shell in vinylidene chloride acrylonitrile. The blowing agent is a volatile organic liquid such as 150-butane. The weight of the unexpanded spheres added to the nitrocellulose lacquer is based upon the total solids of the cellulose nitrate in solution. The micro-spheres are first dispersed into the cellulose nitrate-ethanol-ethyl cellusolve mixture and then passed through a 140 mesh screen to remove any large particles. To this dispersion, 2% trimethlol propane trimethacrylate monomer is added and mixed under vacuum until a uniform dispersion of the solid unexpanded micro-spheres is achieved.

The procedure for making a composite printing plate such as illustrated in FIG. 1 is as follows. A batch of cellulose nitrate lacquer containing the micro-spheres as described above is prepared. A conventional knife-over roll film casting line is used. The casting line includes at least two or more knife-over roll coating stations. This is illuminated in FIG. 3. The base carrier (which ultimately will become the backer 18) for the caseing operation is, by way of example, an anodized sheet aluminum 30 taken off a roll 32 and fed beneath a hopper 34 in which is placed the casting lacquer 36. The casting lacquer is applied to the base carrier 30 by pressure or other feed mechanism and is distributed to the desired thickness as determined by the knife-over roll apparatus 38. The lacquer is passed through a solvent removal station 40 which applies an appropriate amount of heat at a temperature in the range 70 to 95° F. so that a first layer of cellulose nitrate and micro-spheres is formed when dried.

This first layer of lacquer is conveyed from solvent removal station 40 to beneath the hopper 42 which contains more of the cellulose nitrate-microspheres lacquer. In this manner, successive jlayers of this lacquer material are laid down in controlled thicknesses. Following each lay-down, there is a solvent removal operation such as station 41 downstream of hopper and feed mechanism 42 and knife-over roll apparatus 46. These successive lay-downs and solvent removal operations are continued until the solidified mixture of cellulose-nitrate and micro-spheres has a total thickness as desired – normally about 0.010 inches. In like manner, a final layer of solid cellulose-nitrate without the micro-spheres is laid down and passed through a solvent removal station. When such a layer is applied, the final thickness of the lacquer after solvent extraction is on the order of 0.001 to 0.003 inches thick. Following the final lay-down of the substrate materials on the aluminum and the solvent extraction, the solidified lacquer is transported between heated rolls 48 and 50 and that portion of the substrate which consists of the mixture of cellulose nitrate and micro-spheres is expanded to provide the porous portion 16b of the substrate 16 illustrated in FIG. 2. The final thickness of the expanded substrate can be controlled to any desired value, by the number of lay-downs, and the thickness of each lay-down. The final expanded thickness of the substrate will be approximately twice the unexpanded thickness.

During the expansin step, the density of the expandable material decreased from 98 pounds per cubic foot to approximately 32 pounds per cubic foot and the trimethlol propane trimethacrylate monomer polymerized to form a highly cross linked polymer within the celluose nitrate matrix. The purpose of the cross linking monomer is three fold. First, in its monomer form it acts as a plasticizer which aids in the casting process by reducing the amount of shrinkage of the cellulose nitrate during the drying stages. Secondly, it aids in the expansion process by reducing the melt temperature and melt viscosity of the cellulose nitrate, thereby permitting greater expansion of the Saran micro-spheres. And thirdly, the monomer forms an alloy-like mixture with the cellulose nitrate thereby increasing the compression strength of the foamed substrate. When fully expanded, the substrate 16 consists of approximately a 0.002 inch solid cellulose nitrate layer 16a and a foamed cellulose nitrate portion 16b having a thickness of 0.020 to 0.023 inches. The density of the substrate is between 20 to 45 pounds per cubic foot. Each cell within the cellular portion 16b is closed, generally spherical and approximately 14 to 20 microns in diameter.

The final density of the expanded substrate 16 shown in FIG. 2 can be varied over a wide range. It is initially at approximately 98 pounds per cubic inch. By proper adjustment, it can be varied from that density down to as low as 8 pounds per cubic inch. This range in density is achieved by varying the amount of plasticizer, Saran micro-sphere concentration and the expansion conditions. By way of example, the following variations were made with the results being as stated:

Varying the micro-spheres (keeping the above plasticizer and cross-linking agent constant) from 0.6% to 6% by weight to the above cellulose nitrate produced a decrease in the substrate density from 78 pounds per cubic foot to 26 pounds per cubic foot. In another series of experiments, the above plasticizer content was varied from 0% to 10% by weight at constant levels of micro-spheres, cellulose nitrate and cross-linking agent with a resulting decrease in density from 35 pounds per cubic foot to 24 pounds per cubic foot. Many other experiments confirm the controllability of the substra te density.

Another method of achieving a lower density substrate is to use a lower molecular weight cellulose nitrate resin or a mixture of low and medium molecular weight resins. The nitrocellulose resin used in the examples given above is five-sixths second cellulose nitrate ss grade. However one-fourth and one-half second ss or rs viscosity grade materials have been prepared with equally good results.

After expansion, the resulting substrates are pliable enough to be bent so that they can be readily wrapped around a press cylinder. The substrates have good surface finish and compression strength in comparison to other foamed plastics and perform well as a printing plate once developed into a surface in relief. Most importantly, the rate at which the substrate material can be removed is less than one-half that of solid-cellulose nitrate and results in less than one-half the time required in the developing machine to cut the plate.

In addition to the cellulose nitrate formulations described above for the preferred embodiment, the following substrate compositions have been found to be satisfactory for the manufacture of a printing plate substrate.

A batch of methylmethacrylate co-polymer was prepared consisting of 100 grams of 40% solution DuPont 6013 methylmethacrylate co-polymer, 10 grams of triphenol phosphate, 8 grams of trimethyl propane trimethacrylate and 2.4 grams of Saran microspheres. The batch was mixed and screened substantially as described above and cast onto an aluminum base sheet and hot air dried at 95° F. The material was expanded at 300° F. in a hot air oven for 1 minute. As thus expanded, it had a final density of 20 pounds/ft.$^3$. It was thereafter ablated by scanning it with a 350 watt beam of coherent infrared radiation. The first scan was found to remove material from the surface to a depth of 7 mils. Two scans were found to remove material to a depth of 14 mils of material. The ablation was clean in that there was no deleterious residue.

Another batch of material for a substrate was prepared consisting of the following: 100 grams of Rohm & Haas type 147 methyl methacrylate co-polymer (33.3% total solids in toluene), 2.6 grams of Saran micro-spheres, 1.6 grams of trimethyl propane trimethacrylate and 0.2 grams of T-butyl perbenzoate. The batch was mixed and screened as above. Then it was cast onto an aluminum base sheet and expanded in a hot air oven at 280° F. for a period of 1 minute. Final density of the product was 22 pounds/ft.$^3$. Ablation by the aforesaid 350 watt coherent infrared beam resulted in removal of 11 mils of material for the first scan. Two scans were found to remove material from the surface to a depth of 16 mils.

A batch of material was prepared consisting of the following: 100 grams of Rohm & Haas type B-44 methyl methacrylate co-polymer (40% solids in toluene) was mixed with 3.2 grams of Saran micro-spheres. The batch was mixed and screened as above. Then it was cast onto an aluminum base sheet and expanded for 1 minute at 280° F. in a hot air oven to a density of 24 pounds/ft.$^3$. Thereafter, it was ablated using the aforesaid 350 watt infrared coherent radiation. A single scan of the beam removed material from the surface to a depth of 5 mils and two scans of the beam of infrared radiation removed 10 mils of material.

Yet another batch of substrate material was prepared consisting of the following: 100 grams of Rohm & Hass B-48-N methyl methacrylate co-polymer (45% total solids in toluene solution), 3.2 grams Saran microspheres and 0.9 grams trimethyl propane trimethacrylate. The mixture was mixed, screened and cast onto an aluminum base sheet and then hot air dried. This material was expanded in a hot air oven, set at 280° F. for a period of 1 minute. It expanded to a density of 24 pounds/ft.$^3$. The resulting substrate was scanned with the aforesaid 350 watt infrared coherent radiation beam and it was found that the first scan removed material from the surface to a depth of 5 mils and the second scan increased the depth to 14 mils. Ablation was clean in that no deleterious residue was found on the plate.

Each of the following batches of material was mixed, screened and cast, substantially as in the above cellulose nitrate examples.

Still another batch of substrate material was prepared consisting of the following: 100 grams of Rohm & Haas B-50 methyl methacrylate co-polymer (45% total solids in toluene), 3.2 grams of Saran micro-spheres and 0.9 grams of trimethyl propane trimethacrylate. The batch was cast onto an aluminum base sheet and hot air dried as in the previous examples and expanded at 280° F. for 1 minute. The material was found to have expanded to a density of 27 pounds/ ft.³. The material was then scanned with the aforesaid 350 watt coherent infrared radiation beam. The first scan removed material from the surface to a depth of 1 mil and the second beam removed 5 mils.

A further batch of substrate material was prepared consisting of: 100 grams of Ionac X 112 methyl methacrylate co-polymer (43% total solids in toluene) and 3.4 grams Saran micro-spheres. The batch was cast onto an aluminum base sheet and expanded at 280° F. in a hot air oven for a period of 1 minute to a density of 26 pounds/ft.³. Application of the aforesaid 350 watt coherent infrared radiation beam resulted in removal from the surface of material to a depth of 12 mils on two scans of the beam.

Another batch of material was prepared consisting of the following: 100 grams of Ionac MP88 methyl methacrylate co-polymer (43% total solids in toluene) and 3.4 grams Saran micro-spheres. The batch was cast onto an aluminum base sheet and expanded at 280° F. in a hot air oven for a period of 1 minute to a density of 25 pounds/ft.³. Scanning by the aforesaid 350 watt beam of coherent infrared radiation resulted in removal of material from the surface to a depth of 15 mils on two scans of the beam. Inspection revealed that there was clean ablation in that there was no deleterious residual matter on the substrate.

Yet another batch of substrate material was prepared consisting of the following: 100 grams of Ionac MP106 methyl methacrylate co-polymer (43% total solids in 60/40 toluene-ethanol) and 3.4 grams Saran microspheres. The batch was cast onto an aluminum base sheet and expanded in a hot air oven at 280° F. for a period of 1 minute to a density of 28 pounds/ft.³. The resulting substrate was scanned by the aforesaid 350 watt beam of coherent infrared radiation and it was found that two scans of the beam removed material from the surface to a depth of 10 mils with no remaining deleterious residual matter on the substrate.

A batch of substrate material was prepared consisting of the following: 100 grams of Ionac MPX106 methyl methacrylate co-polymer (50% total solids in 80/20 toluene-ethanol), 10 grams trimethylol propane trimethacrylate, .4 grams T-butyl perbenzoate and 4 grams Saran micro-spheres. The batch was cast onto an aluminum base sheet and expanded at 280° F. for a period of 1 minute in a hot air oven to a density of 23 pounds/ft.³. The material was thereafter scanned by the aforesaid beam of coherent infrared radiation resulting in the removal of 11 mils of material using two scans.

The following substrate compositions have been found to be satisfactory for the manufacture of a printing plate substrate using ethyl cellulose. Each was mixed, screened and cast using substantially the same processes described above.

A batch of substrate material was prepared consisting of the following: 100 grams of N-100 Hercules ethyl cellulose (20% solids in 80/20 toluene-ethanol), 2.0 grams trimethylol propane trimethacrylate, 0.6 grams T-butyl peroxide, and 1.6 grams Saran micro-spheres. The batch was cast onto an aluminum base sheet and expanded for 1 minute at 280° F. to a density of 23 pounds/ft.³. Scanning by the aforesaid 350 watt beam of coherent radiation resulted in removal of material from the surface of the material to a depth of 6 mils on one scan of the beam and to a depth of 12 mils on two scans of the beam.

Another batch of material was prepared consisting of the following: 100 grams of N-22 ethyl cellulose (20% solution in 80/20 toluene-ethanol) and 1.6 grams of Saran micro-spheres. The batch was cast onto an aluminum base sheet and expanded to a density of 22 pounds/ft.³. Scanning by a beam of coherent infrared radiation resulted in the removal from the surface of material as follows:

| Beam Power | Depth of Removal |
|---|---|
| 380 watts (one scan) | 11 mils |
| 380 watts (two scans) | 20 mils |
| 300 watts (one scan) | 8 mils |
| 300 watts (two scans) | 16 mils |

Still another batch of substrate material was prepared consisting of the following: 100 grams N-22 ethyl cellulose (20% solution in 80/20 toluene-ethanol), 1.6 grams Saran micro-spheres and 1.0 grams trimethylol propane trimethacrylate. The batch was cast onto an aluminum base sheet and expanded to a density of 20 pounds/ft.³. Scanning by a beam of coherent infrared radiation resulted in the removal from the surface of material as follows:

| Beam Power | Depth of Removal |
|---|---|
| 380 watts (one scan) | 11 mils |
| 380 watts (two scans) | 25 mils |
| 300 watts (one scan) | 9 mils |
| 300 watts (two scans) | 15 mils |

Yet another batch of substrate material was prepared consisting of the following: 100 grams N-10 ethyl cellulose (20% solution in 80/20 toluene-ethanol) and 1.6 grams Saran micro-spheres The batch was cast onto an aluminum base sheet and expanded to a density of 24 pounds/ft.³. Scanning by a beam of coherent infrared radiation resulted in the removal from the surface of material as follows:

| Beam Power | Depth of Removal |
|---|---|
| 380 watts (one scan) | 8 mils |
| 380 watts (two scans) | 20 mils |
| 300 watts (one scan) | 7 mils |
| 300 watts (two scans) | 14 mils |

A further batch of substrate material was prepared consisting of the following: N-10 ethyl cellulose (20% solution in 80/20 toluene-ethanol), 1.6 grams Saran micro-spheres and 1.0 grams trimethylol propane trimethacrylate. The batch was cast onto an aluminum base sheet and expanded to a density of 26 pounds/ft.³. Scanning by a beam of coherent infrared radiation resulted in the removal from the surface of material as follows:

| Beam Power | Depth of Removal |
| --- | --- |
| 380 watts (one scan) | 9 mils |
| 380 watts (two scans) | 20 mils |
| 300 watts (one scan) | 8 mils |
| 200 watts (two scans) | 12 mils |

Yet another batch of substrate material was prepared consisting of the following: 100 grams of N-7 ethyl cellulose (20%) solution in 80/20 toluene-ethanol) and 1.6 grams Saran micro-spheres. The batch was cast onto an aluminum base sheet and expanded to a density of 24 pounds/ft.$^3$. Scanning by a beam of coherent infrared radiation resulted in the removal from the surface of material as follows:

| Beam Power | Depth of Removal |
| --- | --- |
| 380 watts (one scan) | 10 mils |
| 380 watts (two scans) | 19 mils |
| 300 watts (one scan) | 10 mils |
| 300 watts (two scans) | 16 mils |

Still another batch of substrate material was prepared consisting of the following: 100 grams of N-7 ethyl cellulose (20% solution in 80/20 toluene-ethanol), 1.6 grams Saran micro-spheres and 2.0 grams trimethlol propane trimethacrylate (10%). The batch was cast on an aluminum base sheet and expanded to a density of 25 pounds/ft.$^3$. Scanning by a beam of coherent infrared radiation resulting in the removal from the surface of material as follows:

| Beam Power | Depth of Removal |
| --- | --- |
| 380 watts (one scan) | 9 mils |
| 380 watts (two scans) | 15 mils |
| 300 watts (one scan) | 8 mils |
| 300 watts (two scans) | 15 mils |

With respect to each of the above ethyl cellulose substrates, the scan was effected as follows:

For the 380 watt coherent beam, the substrate was displaced at 3.5 inches per minute and the beam was scanned at 0.6 inches per second relative to the substrate.

For the 300 watt coherent beam, the substrate was displaced at 4.95 inches per minute and the beam was scanned 22.75 inches per second relative to the substrate.

The barrier layer 14 is manufactured by a conventional casting process and can be applied directly to the substrate surface 16, 16a or to the writing layer 12 while the writing layer 12 is still on its carrier as described further below. The barrier layer 14 is appropriately secured by a conventional polymer process.

The writing layer, ssuch as copper, is first vapor deposited to a thickness between 400A - 1200A on a carrier 70 as shown in FIG. 4. The carrier 70 is made of a suitable polymer, as for example, Mylar or polypropolene. Thereafter, the barrier layer 14 is cast onto the metal writing layer 12 and the combination of the carrier 70, writing layer 12 and barrier layer 14 is passed through appropriate curing chambers.

Thereafter, the carrier 70, metal writing layer 12 and barrier layer 14 are brought into contact with the subtrate 16 and this sandwich is then subjected to heat and pressure as shown in FIG. 5 by passing it through laminating roller 72 and 74 for manufacture on a continuous line. The sandwich is rolled between heated steel rollers 72 adjacent to the carrier 70, and soft rubber rollers 74 in contact with the backer 18. The amount of pressure applied to the thus assembled composite plate is 60 to 100 pounds per linear inch. As a result, the writing layer 12 and the barrier layer 14 are transferred from the carrier 70 to the substrate layer 16. Thereafter, the carrier 70 is stripped away from the writing layer 12.

The substrate 16 is manufactured in the manner described and shown in FIG. 3 and then fed continuous to the laminating rollers 72 and 74 as shown in FIG. 5. Upon completion of the process of laminating the writing layer 12 and the barrier layer 14 to the substrate 16 and removal of the carrier 70, the composite plate may be cut to appropriate dimensions.

Certain types of printing plates are curved to fit the rollers on printing presses. For manufacturing such printing plates, it may be desirable to laminate the writing layer 12 and barrier layer 14 to the substrate 16 and thereafter affixed the same to curved backers 18.

Regardless of how constructed, the final composite plate 10 will comprise a substrate 16, a barrier layer 14 and the writing layer 12. A backer such as aluminum backer 18 is also preferably but not necessarily included. The structure and materials used for the substrate 16 and the barrier layer each enhance the ability ot manufacture the composite printing plate 10 and may be used individually or together to provide an appropriate printing plate.

The present invention may be embodied in other specific forms without departing from the spirit or essential attributes thereof and, accordingly, reference should be made to the appended claims, rather than to the foregoing specification as indicating the scope of the invention.

I claim:

1. A composite plate, comprising:
   a dimensionally stable cellular polymer substrate selectively removable on exposure to a developing radiation of first wavelength,
   a writing layer overlying the surface of said substrate selectively removable on exposure to a writing radiation of second wavelength but not removable on exposure to said developing radiation, and
   said polymer substrate being selected from the group consisting of cellulose nitrate, methyl methacrylate and ethyl cellulose and cross-linked with trimethylol propane trimethacrylate.

2. A composite plate in accordance with claim 1 wherein said substrate is cellulose nitrate cross-linked with up to 10% by weight trimethylol propane trimethacrylate.

3. A composite plate in accordance with claim 1 wherein the density of said cellular substrate is between 20 pounds/ft.$^3$ and 45 pounds/ft.$^3$ 4. A composite plate, comprising:
   a dimensionally stable cellular polymer substrate selectively removable on exposure to a developing radiation of first wavelength,
   a writing layer overlying the surface of said substrate selectively removable on exposure to a writing radiation of second wavelength but not removable on exposure to said developing radiation,
   said polymer substrate being selected from the group consisting of cellulose nitrate, methyl methacrylate and ethyl cellulose and cross-linked with trimethylol propane trimethacrylate,
   a polymer barrier layer more absorptive of said developing radiation than said polymer substrate, and
   said barrier layer being interposed between said writing layer and polymer substrate.

5. A composite plate in accordance with claim 4 wherein said barrier layer is a layer of said substrate adjacent the writing layer which is solid in that it does not have any cellular structure.

* * * * *